United States Patent
Kim et al.

(10) Patent No.: US 11,070,256 B2
(45) Date of Patent: Jul. 20, 2021

(54) METHOD OF PROCESSING COMMUNICATION SIGNAL AND COMMUNICATION NODE USING THE SAME

(71) Applicant: SOLiD, INC., Seongnam-si (KR)

(72) Inventors: Youngin Kim, Seoul (KR); Seongwook Byun, Gyeonggi-do (KR); Hosik Jang, Gyeonggi-do (KR)

(73) Assignee: SOLiD, INC., Seongnam-si (KR)

( * ) Notice: Subject to any disclaimer, the term of this patent is extended or adjusted under 35 U.S.C. 154(b) by 0 days.

(21) Appl. No.: 16/853,992

(22) Filed: Apr. 21, 2020

(65) Prior Publication Data
US 2020/0336177 A1 Oct. 22, 2020

(30) Foreign Application Priority Data

Apr. 22, 2019 (KR) .................... 10-2019-0046476

(51) Int. Cl.
*H04B 7/02* (2018.01)
*H04B 7/024* (2017.01)

(52) U.S. Cl.
CPC .......... *H04B 7/024* (2013.01); *H04L 2209/34* (2013.01)

(58) Field of Classification Search
CPC .................... H04B 7/0024; H04L 2209/34
USPC .......................................... 375/267
See application file for complete search history.

(56) References Cited

U.S. PATENT DOCUMENTS

| 4,646,061 | A | * | 2/1987 | Bledsoe | .................. H03M 7/42 341/107 |
| 5,170,396 | A | * | 12/1992 | Rivers | ................ G11B 20/1419 375/333 |
| 5,956,674 | A | * | 9/1999 | Smyth | ................. G10L 19/0208 704/200.1 |
| 6,243,496 | B1 | * | 6/2001 | Wilkinson | ........... H04N 5/9261 375/E7.047 |
| 6,442,196 | B1 | * | 8/2002 | Quicksall | .................. H04L 5/16 375/220 |
| 6,987,891 | B2 | * | 1/2006 | Miura | ..................... G06T 9/005 382/173 |

(Continued)

OTHER PUBLICATIONS

Extended European Search Report dated Sep. 23, 2020 in European Application No. 20170635.5.

(Continued)

*Primary Examiner* — Helene E Tayong
(74) *Attorney, Agent, or Firm* — Sughrue Mion, PLLC (57) ABSTRACT

A communication node processing a communication signal in a distributed antenna system includes a data appearance frequency monitor configured to receive a communication signal including a sign bit string, a count leading zero bit string, and an additional data bit string, and to monitor data appearance frequency in the count leading zero bit string included in the received communication signal, a Huffman encoder configured to encode the count leading zero bit string into a corresponding codeword according to a Huffman encoding algorithm based on the data appearance frequency in the count leading zero bit string and an additional bit allocator configured to allocate additional bits to the additional data bit string when the number of bits in the count leading zero bit string decreases during the encoding process.

10 Claims, 6 Drawing Sheets

(56) References Cited

U.S. PATENT DOCUMENTS

2011/0280209 A1* 11/2011 Wegener ................. H03M 7/40
370/329
2012/0250740 A1* 10/2012 Ling ................... H04W 88/085
375/219

OTHER PUBLICATIONS

Anonymous, "Entropy Encoding", Wikipedia entry, Oct. 17, 2017, https://en.wikipedia.org/w/index.php?title=Entropy_encoding&oldid=805743669; retrieved on Sep. 7, 2020 (2 pages total).
Burtscher et al., "High Throughput Compression of Double-Precision Floating-Point Data", Data Compression Conference, 2007, IEEE, pp. 293-302 (10 pages total).
Anonymous, "Distributed Antenna System", Wikipedia entry, Nov. 18, 2018, https://en.wikipedla.org/w/index.php?title-Distrlbuted_antenna_system&oldid=867422584; retrieved on Sep. 8, 2020 (3 pages total).

* cited by examiner

| SIGN | COUNT LEADING ZERO | ADDITIONAL DATA |
|---|---|---|

FIG. 5

| Appearance Frequency (Rate) | Count Leading Zero | Codeword |
|---|---|---|
| 0.28 | 6 | 100 |
| 0.19 | 7 | 101 |
| 0.15 | 8 | 110 |
| 0.10 | 9 | 111 |
| 0.09 | 4 | 1000 |
| 0.08 | 5 | 1001 |
| 0.06 | 10 | 1010 |
| 0.03 | 11 | 1011 |
| 0.02 | 12 | 1100 |

FIG. 6

METHOD OF PROCESSING COMMUNICATION SIGNAL AND COMMUNICATION NODE USING THE SAME

BACKGROUND

1. Field

The disclosure relates to a method of processing a communication signal and a communication node using the same, and more particularly, to a method of encoding a count leading zero bit string into a corresponding codeword according to a Huffman encoding algorithm, and processing a communication signal capable of allocating additional bits to an additional data bit string when the number of bits of the count leading zero bit string decreases during the encoding, and a communication node using the method.

2. Description of the Related Art

A distributed antenna system (DAS) is a system that may solve the problem of communication shadow areas or high traffic concentration in a specific area by spatially distributing a plurality of antennas.

The DAS is installed in buildings, tunnels, subways, etc. to provide communication services even to a shadow area where base transceiver station signals are difficult to reach. The DAS is also used to provide smooth services in stadiums, large-sized facilities, and places where service demand is high.

Because transmission of a large amount of data is also required through the DAS, signal quality improvement in a situation in which lossy compression of data is inevitable is required.

SUMMARY

Provided are a method of encoding a count leading zero bit string into a corresponding codeword according to a Huffman encoding algorithm, and processing a communication signal capable of allocating additional bits to an additional data bit string when the number of bits of the count leading zero bit string decreases during the encoding, and a communication node using the method.

According to an aspect of an embodiment, a communication node processing a communication signal in a distributed antenna system comprises a data appearance frequency monitor configured to receive a communication signal including a sign bit string, a count leading zero bit string, and an additional data bit string, and to monitor data appearance frequency in the count leading zero bit string included in the received communication signal, a Huffman encoder configured to encode the count leading zero bit string into a corresponding codeword according to a Huffman encoding algorithm based on the data appearance frequency in the count leading zero bit string and an additional bit allocator configured to allocate additional bits to the additional data bit string when the number of bits in the count leading zero bit string decreases during the encoding process.

According to an aspect of an embodiments, the count leading zero bit string encoded into the codeword comprises information corresponding to an exponent in data initially included in the communication signal.

According to an aspect of an embodiments, the additional data bit string comprises information corresponding to a mantissa in data initially included in the communication signal.

According to an aspect of an embodiments, the communication node further comprises a leading zero detector configured to detect a leading zero from data initially included in the communication signal and to generate the count leading zero bit string.

According to an aspect of an embodiments, the Huffman encoder determines whether or not a condition for performing Huffman encoding is satisfied according to a result of monitoring the data appearance frequency in the count leading zero bit string, and encodes the count leading zero bit string only when the condition for performing Huffman encoding is satisfied.

According to an aspect of an embodiments, the condition for performing Huffman encoding is a condition that satisfies at least one of a condition in which a difference in the data appearance frequency for each data type in the count leading zero bit string is outside a reference value and a condition in which the data appearance frequency for each data type in the count leading zero bit string does not have a relationship of 2 to the Nth power (where n is a natural number).

According to an aspect of an embodiments, the Huffman encoder, when the condition for performing Huffman encoding is not satisfied, determines whether the condition for performing Huffman encoding is satisfied by integrating the count leading zero bit string and the additional data bit string.

According to an aspect of an embodiments, the additional bit allocator allocates the additional bits to information corresponding to a mantissa from data initially included in the communication signal.

According to an aspect of an embodiments, the communication node is a head-end device in the distributed antenna system.

According to an aspect of an embodiment, a method of processing a communication signal comprises receiving a communication signal including a sign bit string, a count leading zero bit string, and an additional data bit string, and monitoring data appearance frequency in the count leading zero bit string included in the received communication signal, encoding the count leading zero bit string into a corresponding codeword according to a Huffman encoding algorithm based on the data appearance frequency in the count leading zero bit string and allocating additional bits to the additional data bit string when the number of bits in the count leading zero bit string decreases during the encoding process.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

The inventive concept may be variously modified and have various embodiments, so that specific embodiments will be illustrated in the drawings and described in the detailed description. However, this does not limit the inventive concept to specific embodiments, and it should be understood that the inventive concept covers all the modifications, equivalents and replacements included within the idea and technical scope of the inventive concept.

In describing the inventive concept, in the following description, a detailed explanation of known related technologies may be omitted to avoid unnecessarily obscuring the subject matter of the present disclosure. In addition, numeral figures (e.g., 1, 2, and the like) used during describing the specification are just identification symbols for distinguishing one element from another element.

Further, in the specification, if it is described that one component is "connected" or "accesses" the other component, it is understood that the one component may be directly connected to or may directly access the other component but unless explicitly described to the contrary, another component may be "connected" or "access" between the components.

In addition, terms including "unit," "er," "or," "module," and the like disclosed in the specification mean a unit that processes at least one function or operation and this may be implemented by hardware or software such as a processor, a micro processor, a micro controller, a central processing unit (CPU), a graphics processing unit (GPU), an accelerated Processing unit (APU), a digital signal processor (DSP), an application specific integrated circuit (ASIC), and a field programmable gate array (FPGA) or a combination of hardware and software. Furthermore, the terms may be implemented in a form coupled to a memory that stores data necessary for processing at least one function or operation.

Moreover, it is intended to clarify that components in the specification are distinguished in terms of primary functions of the components. That is, two or more components to be described below may be provided to be combined to one component or one component may be provided to be divided into two or more components for each more subdivided function. In addition, each of the respective components to be described below may additionally perform some or all functions among functions which other components take charge of in addition to a primary function which each component takes charge of and some functions among the primary functions which the respective components take charge of are exclusively charged by other components to be performed, of course.

A distributed antenna system according to an embodiment of the inventive concept is a coverage system for in-building service that delivers voice communication and data communication with high quality and seamless access. Further, the distributed antenna system is a system for servicing analog and digital telephone systems being serviced in multiple bands with at least one antenna.

The distributed antenna system according to an embodiment of the inventive concept improves a poor propagation environment in a building, improves a poor received signal strength indication (RSSI) and the overall reception sensitivity of a mobile terminal, chip energy/other interferences (Ec/Io), and provides a mobile communication service to every corner of the building so that a user of the mobile communication service can freely talk anywhere in the building.

The distributed antenna system according to an embodiment of the inventive concept may support the mobile communication standard used worldwide. For example, the distributed antenna system may support a time division duplex (TDD) service as well as a frequency division duplex (FDD) service, a very-high frequency (VHF), an ultra-high frequency (UHF), and frequencies of 700 MHz, 800 MHz, 850 MHz, 900 MHz, 1900 MHz, 2100 MHz, and 2600 MHz bands. Furthermore, the distributed antenna system may support a number of mobile communication standards such as a typical analog mobile communication service, that is, an advanced mobile phone service (AMPS), digital time-division multiple access (TDMA), code-division multiple access (CDMA), wideband code-division multiple access (WCDMA), high-speed downlink packet access (HSDPA), long-term evolution (LTE), LTE-advanced (LTE-A), 5G, and so on.

Figure 1:
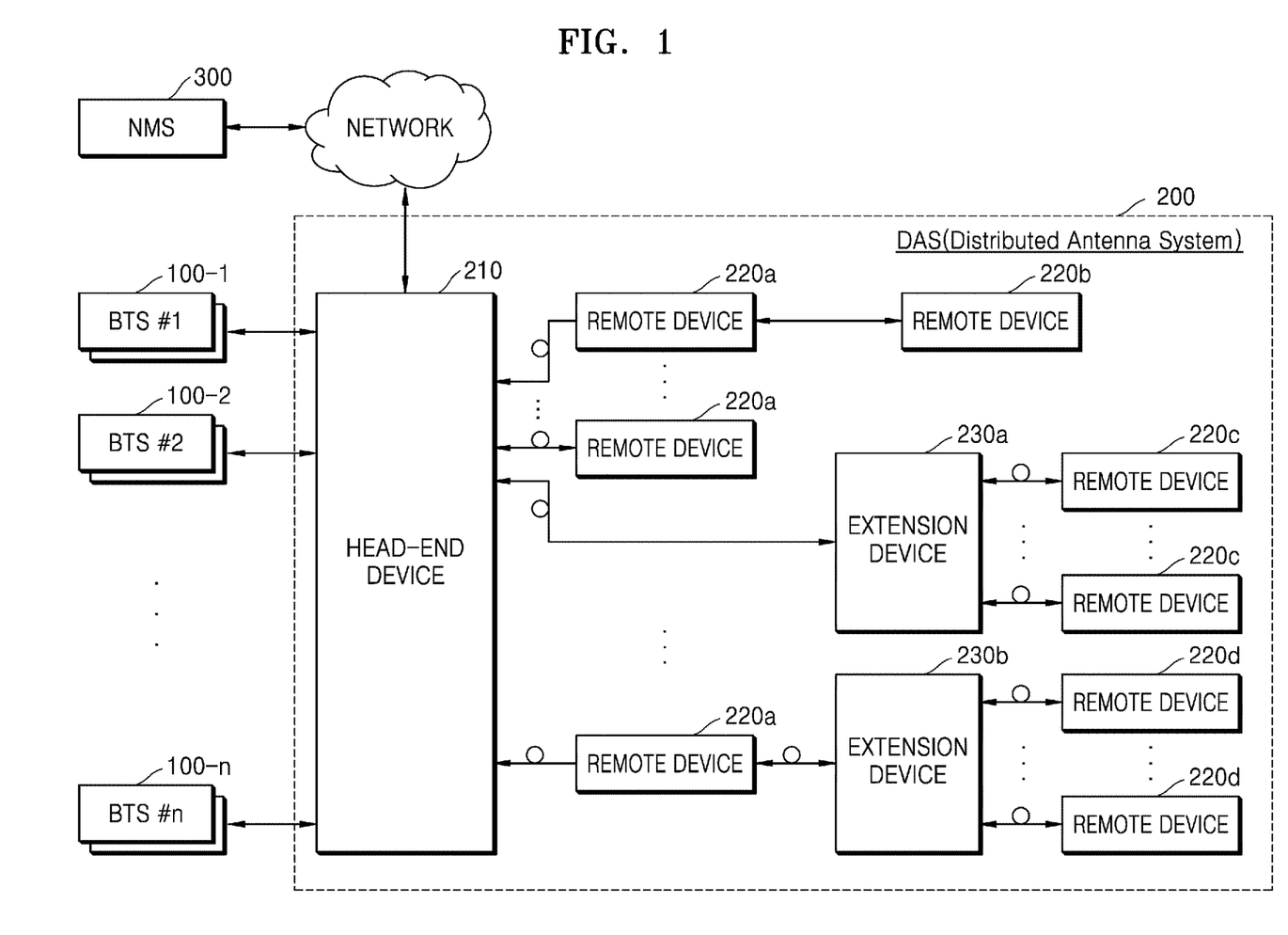
FIG. 1 is a block diagram of a distributed antenna system including a communication node according to an embodiment of the disclosure.

FIG. 1 is a block diagram of a distributed antenna system including a communication node according to an embodiment of the disclosure.

Referring to FIG. 1, a distributed antenna system (DAS) 200 may include a head-end device 210 that constitutes a head-end node and are communicatively connected to a plurality of base transceiver stations (BTS) 100-1 to 100-n, a plurality of remote devices 220a, 220b, 220c, and 220d that constitute a remote node and are connected to another remote node or communicatively connected to a user terminal by being arranged at each remote service location, and extension devices 230a and 230b that constitute an extension node.

Each of the head-end device 210, the plurality of remote devices 220a, 220b, 220c, and 220d, and the expansion devices 230a, 230b may constitute a communication node for transmitting communication signals within the DAS 200.

According to an embodiment, the DAS 200 may be implemented as an analog DAS.

According to another embodiment, the DAS 200 may be implemented as a digital DAS, and in some cases may be implemented as a mixed form thereof (e.g., some nodes perform analog processing and the other nodes perform digital processing).

According to another embodiment, the DAS 200 may include some configurations of the plurality of BTS 100-1 to 100-n or may perform some functions of the plurality of BTS 100-1 to 100-n.

Meanwhile, FIG. 1 shows an example of a topology of the DAS 200 and various variations are possible in the DAS 200 considering specificity of installation areas and application fields (e.g., in-building, a subway, a hospital, a stadium, etc.). For example, the number of the head-end device 210, the remote devices 220a, 220b, 220c, and 220d, and the extension devices 230a and 230b, and a connection relationship between upper and lower ends thereof may be different from FIG. 1.

The extension devices 230a and 230b in the DAS 200 may be utilized when the number of branches of the head-end device 210 is limited compared to the number of remote devices to be installed.

Each node in the DAS 200 and its function will be described in more detail. First, the head-end device 210 may serve as an interface with a base station. FIG. 1 shows that the head-end device 210 is connected to the plurality of BTS 100-1 to 100-n (where n is a natural number of 2 or more).

According to an embodiment, the head-end device 210 may be implemented with a main head-end device and a sub head-end device, and may be connected to a base station for each service frequency band of a specific service provider or a base station for each sector. In some cases, the main head-end device may compensate for coverage by the sub head-end device.

In general, since a radio frequency (RF) signal transmitted from a base station is a high-power signal, the head-end device 210 may attenuate such a high-power RF signal into a signal of power suitable for processing at each node. The head-end device 210 may lower a high-power RF signal for each frequency band or for each sector to a low-power RF signal. The head-end device 210 may be combined with the low-power RF signal and may distribute the combined signal to the extension device 230a or the remote device 220a.

According to an embodiment, the head-end device 210 may receive a digital format signal (e.g., CPRI, OBSAI, ORI, eCPRI, etc.) from each of the plurality of BTS 100-1 to 100-n and process the same.

According to another embodiment, the head-end device 210 may directly receive a baseband signal from each of the BTS 100-1 to 100-n and process the same. In this case, the head-end device 210 of the DAS 200 may perform at least a part of the base station.

Each of the remote devices 220a, 220b, 220c, and 220d may separate received combined signals for each frequency band and perform signal processing such as amplification. Accordingly, each of the remote devices 220a, 220b, 220c, and 220d may transmit a base station signal to a user terminal in its service coverage through a service antenna (not shown).

The remote device 220a and the remote device 220b may be connected to each other through an RF cable or wireless communication, and a plurality of remote devices may be connected to each other in a cascade structure if necessary.

The extension device 230a may transmit the distributed combined signal to the remote device 220c connected to the extension device 230a.

The extension device 230b is connected to one end of the remote device 220a and may receive a signal received from the head-end device 210 through the remote device 220a in downlink communication. The extension device 230b may transmit the received signal back to the remote device 220d connected to a rear end of the extension device 230b.

Although FIG. 1 shows that the plurality of BTS 100-1 to 100-n and the head-end device 210 are connected to each other by wire and are connected to each other through an optical cable at a lower end of the head-end device 210 except for the remote device 220a and the remote device 220b, a signal transport medium or a communication method between each node may vary.

For example, at least one of between the head-end device 210 and the extension device 230a, between the head-end device 210 and the remote device 220a, between the extension devices 230a and 230b and the remote device 220c and 220d may be connected through an RF cable, a twisted cable, a UTP cable or the like in addition to the optical cable.

However, the following description will be made with reference to FIG. 1. Therefore, in the DAS 200, the head-end device 210, the remote devices 220a, 220b, 220c, and 220d, and the extension devices 230a and 230b may include an optical transceiver module for transmitting and receiving optical signals through electro-optical conversion/photo-electric conversion, and may further include a wavelength division multiplexing (WDM) device when nodes are connected to each other by a single optical cable.

The DAS 200 may be connected to an external management device (not shown) such as a network management server or a network management system (NMS) 300 or a network operation center (NOC) (not shown) via a network. Accordingly, an administrator may remotely monitor the status and problem of each node of the DAS 200, and may remotely control the operation of each node.

Figure 2:
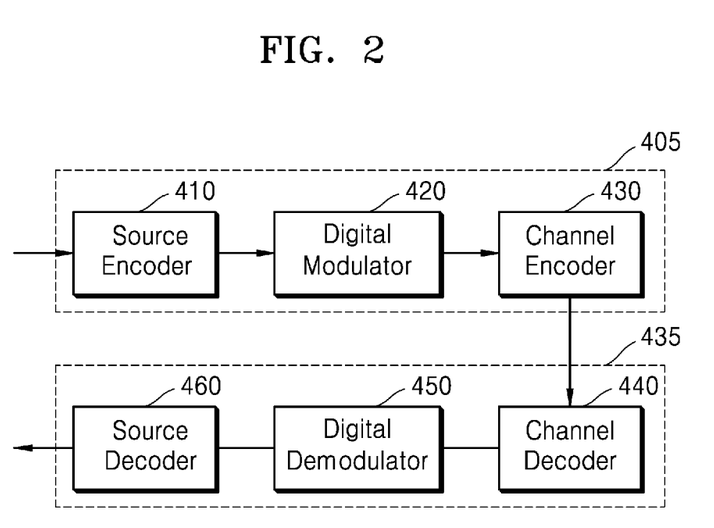
FIG. 2 is a view illustrating an exemplary configuration of communication nodes performing a method of processing a communication signal in the distributed antenna system of FIG. 1.

FIG. 2 is a view illustrating an exemplary configuration of communication nodes performing a method of processing a communication signal in the distributed antenna system of FIG. 1.

Referring to FIGS. 1 and 2, FIG. 2 exemplarily illustrates a process in which communication signals are processed in at least two communication nodes of the communication nodes (e.g., 100-1 to 100-n, 210, and 220a to 220d) of FIG. 1.

Each of a first communication node 405 and a second communication node 435 of FIG. 2 may correspond to any one of the communication nodes (e.g., 100-1 to 100-n, 210, and 220a to 220d).

For convenience of description, FIG. 2 shows that the first communication node 405 includes a source encoder 410, a digital modulator 420, and a channel encoder 430, and the second communication node 435 includes a channel decoder 440, a digital demodulator 450, and a source decoder 46. However, according to an embodiment, the components 410 to 430 of the first communication node 405 may be divided into and included in the communication nodes (e.g., 100-1 to 100-n, 210, and 220a to 220d) and the components 440 to 460 of the second communication node 434 may also be divided into and included in the communication nodes (e.g., 100-1 to 100-n, 210, and 220a to 220d).

According to an embodiment, the first communication node 405 may be the head-end device 210, and the second communication node 435 may be a terminal communication node (e.g., the remote device 220b, 220c, or 220d) of the DAS 200.

The source encoder 410 may receive a communication signal and perform formatting and compression (e.g., lossless compression or lossy compression) of the received communication signal.

According to an embodiment, the source encoder 410 may perform encoding of the communication signal, for example, Huffman encoding.

The digital modulator 420 may perform digital modulation of the communication signal. According to an embodiment, the digital modulator 420 may transmit the communication signal to any one of Quadrature Phase Shift Keying (QPSK), Quadrature Amplitude Modulation (4-QAM), 16-QAM, 64-QAM, 256-QAM, and 1024-QAM modulation modes.

The channel encoder 430 may add a parity bit to the communication signal.

The channel decoder 440 may detect an error in a communication channel and correct the detected error using the parity bit added to the communication signal by the channel encoder 430.

The digital demodulator 450 may demodulate the communication signal in a modulation mode (e.g., any one of QPSK, 4-QAM, 16-QAM, 64-QAM, 256-QAM, and 1024-QAM modulation modes) modulated by the digital modulator 420.

The source decoder 460 may restore and output the communication signal demodulated and transmitted by the digital demodulator 450 as the original data.

The method of processing a communication signal according to an embodiment of the disclosure may be performed by being included in an encoding process of the source encoder 410 or a demodulation process of the digital modulator 420.

Figure 3:
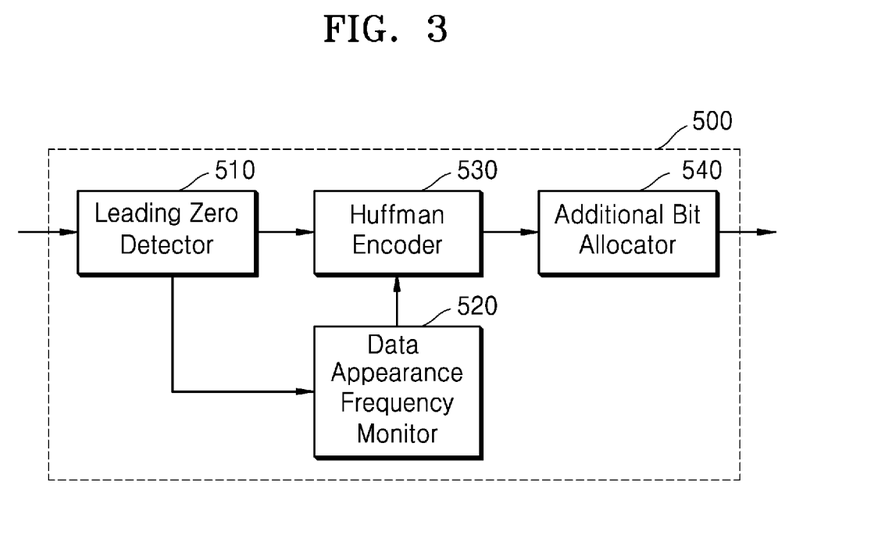
FIG. 3 is a view illustrating an exemplary configuration of an encoding device for performing Huffman encoding in the communication nodes shown in FIG. 2.
Figure 4:
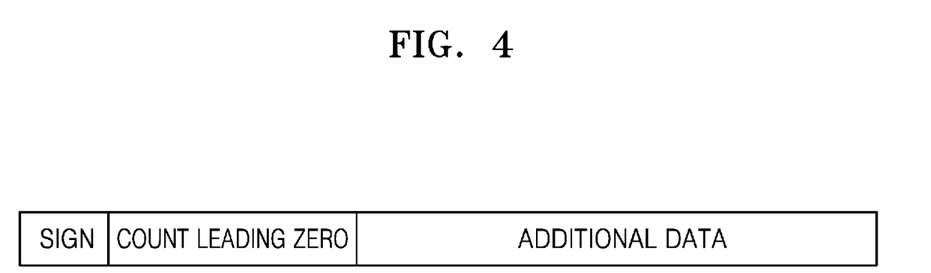
FIG. 4 is a view of a data structure included in a communication signal processed by the encoding device shown in FIG. 3.
Figure 5:
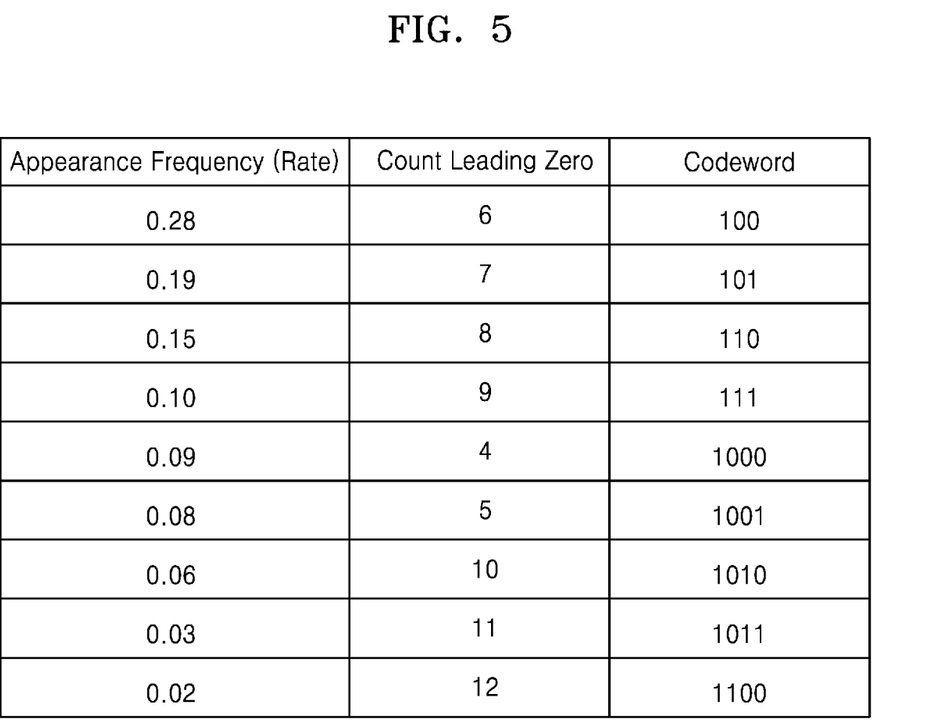
FIG. 5 is a view illustrating an example of a mapping table used in a Huffman encoding process in the encoding device shown in FIG. 3.

FIG. 3 is a view illustrating an exemplary configuration of an encoding device for performing Huffman encoding in the communication nodes shown in FIG. 2. FIG. 4 is a view of a data structure included in a communication signal processed by the encoding device shown in FIG. 3. FIG. 5 is a view illustrating an example of a mapping table used in a Huffman encoding process in the encoding device shown in FIG. 3.

Referring to FIGS. 2 and 3, an encoding device 500 of FIG. 3 may include a leading zero detector 510, a data appearance frequency monitor 520, a Huffman encoder 530, and an additional bit allocator 540.

According to an embodiment, the encoding device 500 may receive floating-point data, and the received data may include a sign bit string, an exponent bit string, and a mantissa bit string.

The leading zero detector 510 may detect leading zeros from data included in a communication signal initially received by the encoding device 500 and output data including a count leading zero bit string. The count leading zero bit string may include information about the number of zeros from the floating-point data to the first 1 after a decimal point, that is, information corresponding to an exponent in the floating-point data.

When the count leading zero bit string is generated by the leading zero detector 510, the data included in the communication signal may have a data structure in the form shown in FIG. 4.

The sign bit string may include information about a sign of data, the count leading zero bit string may include information about a mantissa of data, and an additional data bit string may include information about a mantissa of data and bits for error correction of a communication signal.

Referring to FIG. 3, the data appearance frequency monitor 520 may monitor data appearance frequency for each data type in the count leading zero bit string generated by the leading zero detector 510.

Referring to FIG. 5 together, the data appearance frequency monitor 520 may monitor the data appearance frequency for each of data '4' to '12' in the count leading zero bit string and check a ratio of the data appearance frequency. Although FIG. 5 shows that the data appearance frequency monitor 520 monitors the rate of the data appearance frequency as an example, the data appearance frequency monitor 520 may monitor the data appearance frequency by the number of times.

For example, the frequency (ratio) of data '4' may be 0.09, the frequency (ratio) of data '5' may be 0.08, and the frequency (ratio) of data '6' may be 0.28.

Referring again to FIG. 3, the Huffman encoder 530, based on the data appearance frequency in the count leading zero bit string monitored by the data appearance frequency monitor 520, may encode the count leading zero bit string into a corresponding codeword according to a Huffman encoding algorithm.

Referring to FIG. 5 together, the Huffman encoder 530 may encode the count leading zero bit string into a corresponding codeword by using a mapping table that maps fewer bits of codeword as data with higher data appearance frequency.

For example, in the case of data '6' having high data appearance frequency, the Huffman encoder 530 may encode the count leading zero bit string into a codeword '100' having a relatively small number of bits, and in the case of data '12' having low data appearance frequency, the Huffman encoder 530 may encode the count leading zero bit string into a codeword '1100' having a relatively large number of bits.

According to an embodiment, the Huffman encoder 530, by determining whether the data appearance frequency monitor 520 satisfies a condition for performing Huffman encoding according to a result of monitoring the data appearance frequency in the count leading zero bit string, may encode the count leading zero bit string only when the condition for performing Huffman encoding is satisfied.

According to an embodiment, the condition for performing Huffman encoding may be a condition that satisfies at least one of a first condition and a second condition, the first condition in which a difference in the data appearance frequency for each data type in the count leading zero bit string is outside a reference value and the second condition in which the data appearance frequency for each data type in the count leading zero bit string does not have a relationship of 2 to the $N^{th}$ power (where n is a natural number).

When the condition for performing Huffman encoding does not satisfy the first condition or the second condition, the efficiency according to Huffman encoding decreases, so the Huffman encoder 530 may not perform Huffman encoding.

For example, assuming that the first condition is a condition in which the maximum value of a difference in the frequency (ratio) of appearance for each data type is outside a reference value 0.03, FIG. 5 may be a case that satisfies the first condition outside the reference value 0.03 because the maximum value of the difference in the frequency (ratio) of appearance for each data type is 0.26 (0.28-0.02).

For example, whether the condition for performing Huffman encoding corresponds to the second condition may be analyzed by the data appearance frequency for each data type. When the frequency when a data value of the count leading zero bit string is '4' is 2, the frequency when the data value is '5' is 4, and the frequency when the data value is '6' is 8, the condition for performing Huffman encoding may not satisfy the second condition because the data appearance frequency for each data type has a relationship of 2 to the $N^{th}$ power (where n is a natural number).

According to an embodiment, when the Huffman encoder 530 determines that the condition for performing Huffman encoding is not satisfied, the Huffman encoder 530 may determine whether the condition for performing Huffman encoding is satisfied by integrating the count leading zero bit string and the additional data bit string.

According to another embodiment, the Huffman encoder 530 may determine whether the additional data satisfies the condition for performing Huffman encoding, and may perform Huffman encoding on the additional data according to a result of the determination.

The additional bit allocator 540 may allocate additional bits to the additional data bit string when the number of bits of the count leading zero bit string decreases during the encoding process of the Huffman encoder 530.

According to an embodiment, the additional bit allocator 540 may allocate additional bits to information corresponding to the mantissa in the additional data bit string.

According to another embodiment, the additional bit allocator 540 may allocate additional bits to a parity bit included in the additional data bit string.

Figure 6:
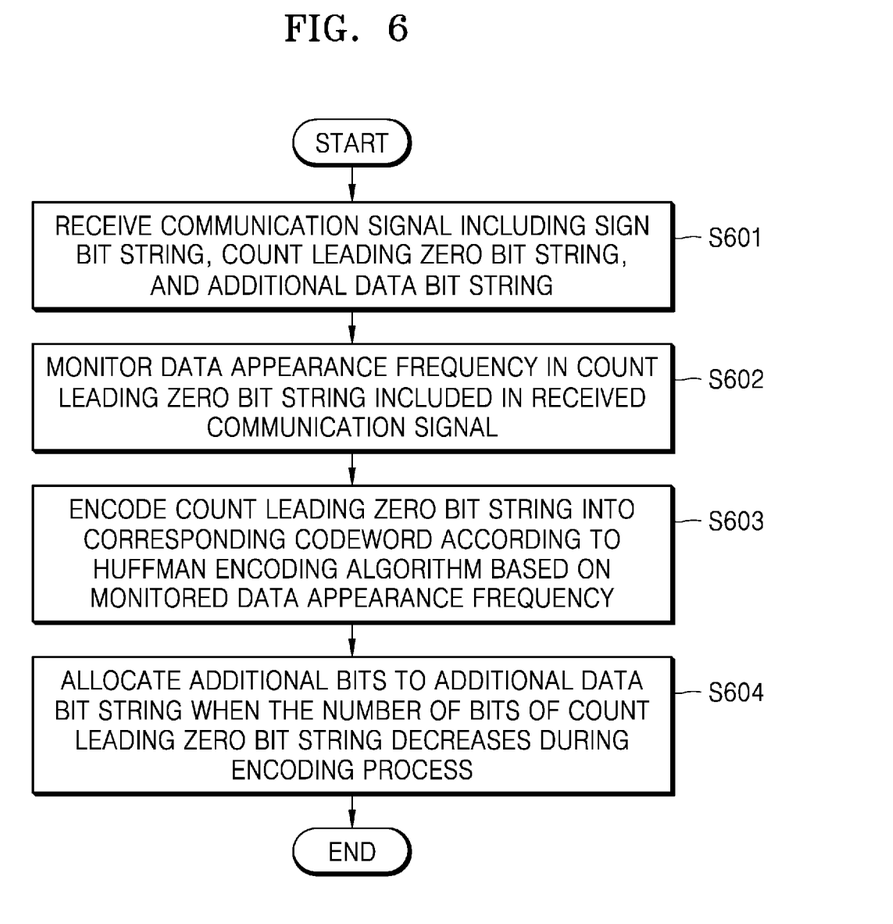
FIG. 6 is a flowchart of a method of processing a communication signal according to an embodiment of the disclosure.

FIG. 6 is a flowchart of a method of processing a communication signal according to an embodiment of the disclosure.

Referring to FIGS. 1 to 6, in operation S601, a communication node may receive a communication signal including a sign bit string, a count leading zero bit string, and an additional data bit string.

In operation S602, the communication node may monitor data appearance frequency for each data type in the count leading zero bit string included in the received communication signal.

The data appearance frequency in operation S602 may be monitored in the form of the number of data appearances or the rate of data appearances.

In operation S603, the communication node may encode the count leading zero bit string into a corresponding codeword according to a Huffman encoding algorithm based on the monitored data appearance frequency.

According to an embodiment, the higher the monitored data appearance frequency is, the more the corresponding data may be encoded into a codeword with a lower number of bits, and the relatively lower the monitored data appearance frequency is, the more data may be encoded into a codeword with a higher number of bits.

In operation S604, when the number of bits of the count leading zero bit string decreases during the encoding process, the communication node may allocate additional bits to the additional data bit string.

According to an embodiment, the additional bit may be allocated to information or a parity bit corresponding to a mantissa.

A method and a device according to the disclosure have an effect of improving signal quality even in a situation where lossy compression of data is inevitable by encoding a count leading zero bit string into a corresponding codeword according to a Huffman encoding algorithm, and by allocating additional bits to an additional data bit string when the number of bits of the count leading zero bit string decreases during the encoding.

Hereinabove, the disclosure has been described with reference to the preferred embodiments. However, it will be appreciated by one of ordinary skill in the art that various modifications and changes of the disclosure can be made without departing from the spirit and the scope of the inventive concept which are defined in the appended claims and their equivalents.

What is claimed is:

1. A communication node in a distributed antenna system, the communication node comprising:
   a data appearance frequency monitor configured to receive a communication signal including a sign bit string, a count leading zero bit string, and an additional data bit string, and to monitor data appearance frequency in the count leading zero bit string included in the received communication signal;
   a Huffman encoder configured to encode the count leading zero bit string into a corresponding codeword according to a Huffman encoding algorithm based on the data appearance frequency in the count leading zero bit string; and
   an additional bit allocator configured to allocate additional bits to the additional data bit string when the number of bits in the count leading zero bit string decreases during the encoding process.

2. The communication node of claim 1, wherein the count leading zero bit string encoded into the codeword comprises:
   information corresponding to an exponent in data initially included in the communication signal.

3. The communication node of claim 1, wherein the additional data bit string comprises:
   information corresponding to a mantissa in data initially included in the communication signal.

4. The communication node of claim 1, wherein the communication node further comprises:
   a leading zero detector configured to detect a leading zero from data initially included in the communication signal and to generate the count leading zero bit string.

5. The communication node of claim 1, wherein the Huffman encoder determines whether or not a condition for performing Huffman encoding is satisfied according to a result of monitoring the data appearance frequency in the count leading zero bit string, and encodes the count leading zero bit string only when the condition for performing Huffman encoding is satisfied.

6. The communication node of claim 5, wherein the Huffman encoder, when the condition for performing Huffman encoding is not satisfied, determines whether the condition for performing Huffman encoding is satisfied by integrating the count leading zero bit string and the additional data bit string.

7. The communication node of claim 5, wherein the condition for performing Huffman encoding is a condition that satisfies at least one of a condition in which a difference in the data appearance frequency for each data type in the count leading zero bit string is outside a reference value and a condition in which the data appearance frequency for each data type in the count leading zero bit string does not have a relationship of 2 to the Nth power (where n is a natural number).

8. The communication node of claim 1, wherein the additional bit allocator allocates the additional bits to information corresponding to a mantissa from data initially included in the communication signal.

9. The communication node of claim 1, wherein the communication node is a head-end device in the distributed antenna system.

10. A method of processing a communication signal, the method comprising:
    receiving the communication signal including a sign bit string, a count leading zero bit string, and an additional data bit string, and monitoring data appearance frequency in the count leading zero bit string included in the received communication signal;
    encoding the count leading zero bit string into a corresponding codeword according to a Huffman encoding algorithm based on the data appearance frequency in the count leading zero bit string; and allocating additional bits to the additional data bit string when the number of bits in the count leading zero bit string decreases during the encoding process.

* * * * *